United States Patent

Davis

[15] 3,671,767

[45] June 20, 1972

[54] HALL EFFECT SWITCHING DEVICE

[72] Inventor: Walter Richard Davis, Tempe, Ariz.

[73] Assignee: Motorola, Inc., Franklin Park, Ill.

[22] Filed: Jan. 15, 1971

[21] Appl. No.: 106,865

[52] U.S. Cl. ............................................307/309, 307/290
[51] Int. Cl. ............................................H01r 5/00
[58] Field of Search ..........................................307/290, 309

[56] References Cited

UNITED STATES PATENTS

| | | | |
|---|---|---|---|
| 3,213,293 | 10/1965 | Finlon et al. | 307/290 |
| 3,054,910 | 9/1962 | Bothwell | 307/290 |
| 3,416,004 | 10/1968 | Taylor | 307/290 |
| 3,089,966 | 5/1963 | Proctor | 307/290 |
| 3,294,981 | 12/1966 | Bose | 307/290 |
| 3,551,697 | 12/1970 | Candy | 307/290 |
| 3,194,886 | 7/1965 | Mason | 307/309 |

FOREIGN PATENTS OR APPLICATIONS

| | | | |
|---|---|---|---|
| 1,236,001 | 3/1967 | Germany | 307/290 |

*Primary Examiner*—Stanley D. Miller, Jr.
*Assistant Examiner*—Harold A. Dixon
*Attorney*—Mueller & Aichele

[57] ABSTRACT

There is disclosed a Hall effect switching device involving the combination of a Hall effect device, a differential amplifier and a current control trigger circuit. The use of the differential amplifier in conjunction with the current control-trigger circuit amplifies the Hall effect voltage and permits the use of high hysteresis triggers. Control of the current control-trigger circuit is accomplished by a pair of current sources, the output of one of which is varied in response to the output of the differential amplifier. The trigger circuit is initially unbalanced in its OFF mode and is turned ON by the output of the amplifier reaching a predetermined high value. The trigger is turned OFF by the output of the differential amplifier returning to some specified low value.

10 Claims, 4 Drawing Figures

INVENTOR
Walter R. Davis
BY Mueller & Aichele
ATTY'S

INVENTOR.
Walter R. Davis
BY Mueller & Aichele
ATTY'S

HALL EFFECT SWITCHING DEVICE

BACKGROUND

This invention relates to Hall circuits and more particularly to a Hall effect switch incorporating a Hall effect device, a differential amplifier, a current control circuit and a trigger circuit.

It has been characteristic of the prior art of Hall effect switches that these devices have somewhat unpredictable switching characteristics. The reason for the unpredictability of Hall effect switching characteristics is the Hall effect device itself which produces voltages of such low magnitude that they are difficult to process.

Hall effect devices are coupled to various trigger circuits in order to utilize these small voltages in a switching configuration. As such these devices are used in proximity switches, push buttons and computer keyboard inputs. However, when Hall effect devices are directly coupled, for instance, to a Schmidt trigger the voltage differential between the two states of the Hall effect device is very small requiring the design of a low hysteresis trigger. Low hysteresis triggers require precision components and are therefore difficult to integrate.

If, however, the Hall effect device is coupled to a differential amplifier having a single ended output through a differential-to-single-ended converter and this converter is coupled to a variable current source, then the conventional Schmidt trigger can be easily controlled by the very small voltage output of the Hall effect device. This precludes the necessity of specially designing a low hysteresis Schmidt trigger.

SUMMARY OF THE INVENTION

It is therefore an object of this invention to provide the combination of a Hall effect device, differential amplifier and a trigger circuit so as to form a Hall effect switch which is extremely stable and which may utilize a high hysteresis trigger circuit.

It is another object of this invention to provide a differential amplifier-variable current source combination which utilizes Hall voltage from a Hall effect device to drive a trigger circuit.

It is a further object of this invention to provide an improved Hall effect switch utilizing a high hysteresis Schmidt trigger.

It is a further object of this invention to provide a Hall effect switching device incorporating a differential amplifier and a differential-to-single-ended converter which produces a signal to control the current source drive to a trigger circuit.

Other objects of this invention will be better understood upon reading the following description of the accompanying drawings, wherein

BRIEF DESCRIPTION OF THE INVENTION

In general this invention relates to the combination of a Hall effect device and a differential amplifier which controls a current source to a trigger circuit so as to provide an extremely stable Hall effect switching system. The output of the differential amplifier is made single ended by the inclusion of a differential-to-single-ended converter. In one configuration the differential amplifier is buffered from the Hall effect device by emitter follower transistors to prevent loading.

The differential amplifier is driven by the Hall effect device which has an output about midway between the usual supply voltage of 5 volts and ground. The output of the differential amplifier is level shifted by the converter closer to ground so that as close to a 0–5 volt range as possible is achieved.

Thus the differential amplifier serves both as an amplifier and as a level shifting device, so that the output of the Hall effect device can be made compatible with current source driven trigger circuits.

DETAILED DESCRIPTION OF THE INVENTION

Figure 1:
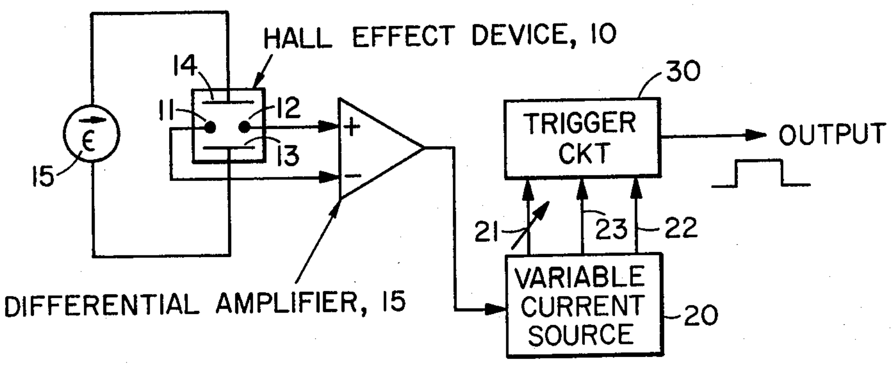
FIG. 1 is a block diagram of the subject invention showing the combination of a Hall effect device, a differential amplifier and variable current source trigger circuit.

Referring to FIG. 1, a typical Hall effect device 10 is shown in schematic form. It is the property of this Hall effect device that when an appropriate magnetic field is superimposed thereon (as for instance by swinging a magnet into position above the device), a differential voltage will appear between points 11 and 12. When this magnetic field is removed the voltage differential between points 11 and 12 will be diminished. The strength of the magnetic field is governed by Hall effect device parameters and by the electric field generated at contacts 13 and 14 which are connected to a D.C. source of potential voltage shown diagrammatically at 15. A typical Hall effect device is shown in U.S. Pat. No. 2,714,182 issued to W. H. Huett, Jr., July 26, 1955. The output of the Huett device is shown at numerals 17 and 18 which correspond to points 11 and 12 in the subject case. Likewise, electrodes 13 and 14 in the subject case correspond to electrodes 15 and 16 in the Huett patent.

The differential output voltage of the Hall effect device 10 is applied across a differential amplifier 15 which produces a differential current between two output legs proportional to the voltage differential between the inputs to the differential amplifier. The above mentioned differential current is fed into a differential-to-single-ended converter which produces a single ended current proportional to the current differential. For purposes of this description, the single ended current is the output of the differential amplifier 15. The output of the differential amplifier 15 is coupled to a variable current source 20 which produces a differential current between two legs 21 and 22. The differential effect is accomplished by varying the current in one leg as a function of the aforementioned single ended current.

It will be appreciated that the aforementioned differential currents developed internal to the differential amplifier 15 could be coupled directly to the variable current source 20 so as to vary the current in both leg 21 and leg 22 by providing the current source 20 with a differential pair of transistors (not shown) and by connecting the differential currents across the differential pair. The reason this is not done is to make use of the aforementioned level shifting function of the converter so as to increase the operating range from 0–2.5 volts to 0–5 volts.

As mentioned hereinbefore, in order to vary the current in one leg, the current output of the differential amplifier 15 is converted to a single ended current which is applied to the variable current source 20. This single ended current alters the current generated by the current source 20, as shown by the arrow through the leg 21, such that this current is supplied to one of the legs of the trigger circuit, shown diagrammatically at box 30. The other leg of the trigger circuit 30 is supplied with a constant current. This constant current is delivered to trigger circuit 30 by leg 22. The emitters of the trigger are provided with a constant current from the current source 20 by a leg 23. The combination of the differential amplifier and the variable current source provide control for the trigger.

It will be appreciated that most trigger circuits, of which the Schmidt trigger is typical, have a high hysteresis. Hysteresis for a trigger circuit can be defined as the difference between the signal required to turn on the trigger and the signal required to return the trigger to the OFF condition. This signal may be either a voltage or a current depending on the type of trigger. Schmidt triggers are generally composed of a differential pair of transistors in which one of the transistors is connected to the voltage supply through a voltage dividing circuit, and in which the other transistor is cross coupled to this transistor at some point between the ends of the voltage dividing circuit. High hysteresis is not a problem when the Hall effect device 10 is coupled thereto by the differential amplifier 15 and variable current source means. This is because the differential amplifier 15 serves two purposes. The first is to amplify the small output voltage differential of the Hall effect device by providing an amplified current and secondly to provide the aforementioned level shifting function. The driving of the trigger circuit with a variable current source overcomes the large hysteresis problem since the Hall effect device is not directly connected across the trigger circuit. Rather, a differential current is artificially generated in linear response to the voltage differential of the Hall effect device. Thus, the trigger operates in a differential current control mode as opposed to the prior art voltage control mode.

Figure 2:
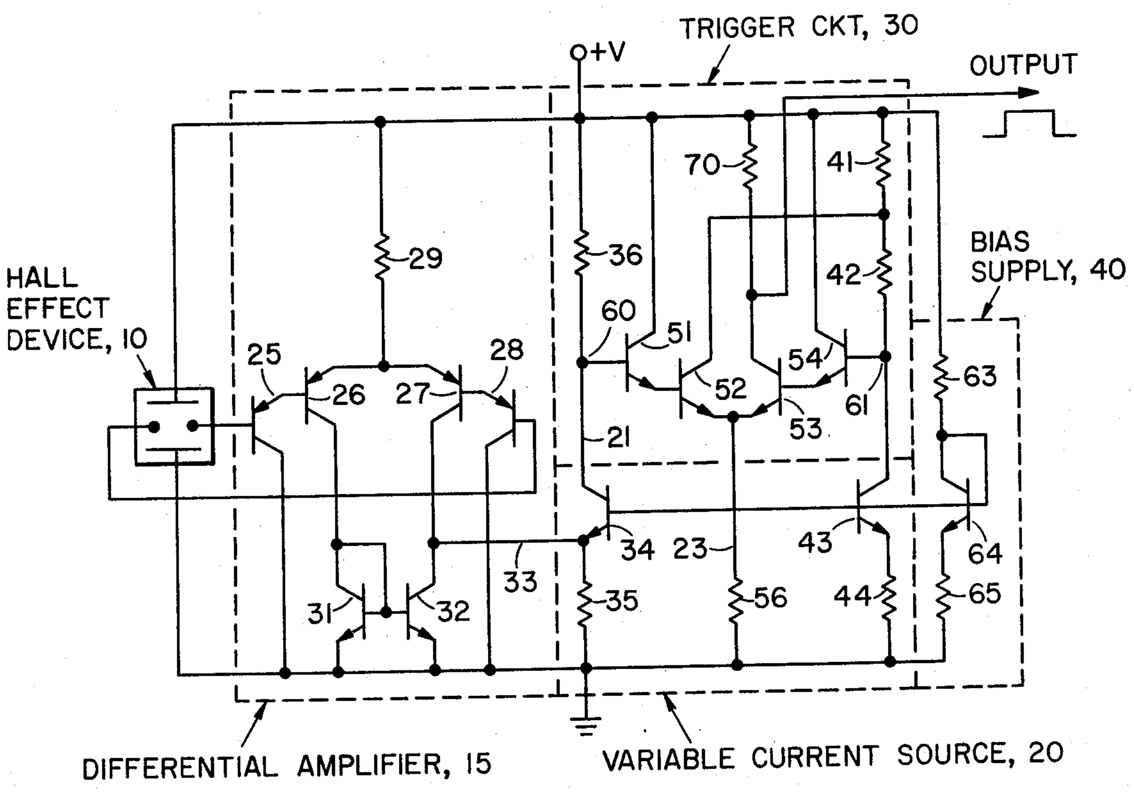
FIG. 2 is a complete schematic diagram of the Hall effect switch shown in FIG. 1.

Referring to FIG. 2, the blocks of FIG. 1 are shown in dotted outline in FIG. 2. In this configuration the Hall effect device is shown connected across a PNP differential amplifier composed of transistors 25, 26, 27 and 28 connected as shown. Alternately, the buffer stage to the PNP differential pair may be in the form of two NPN transistors. This configuration is shown in dotted box 80 of FIG. 4, where the PNP differential amplifier is composed of the transistors 26 and 27, while the buffer stage is composed of transistors 81 and 82. Bias for the transistors 81 and 82 is provided by resistors 83 and 84 connected to respective emitters as shown. Returning to FIG. 2, the output of this differential amplifier is a current differential between the collectors of the transistors 26 and 27.

This differential current is converted into a single ended current by a differential-to-single-ended converter composed of a diode connected transistor 31 and a transistor 32, coupled between these aforementioned collectors and a ground potential. The transistors 31 and 32 are back to back NPN transistors with the base of both transistors coupled to the collector of the transistor 31. The devices have identical emitter areas and therefore have identical emitter currents. Thus the current flowing out of the collector of the transistor 26 equals the current into the collector of the transistor 32. In this way the difference between currents at the collectors of the transistors 26 and 27 will flow into or out of a lead 33. The application of the current in the lead 33 to the transistor 34 varies the current generated by this transistor, resulting in an amplified signal to the trigger that is proportional to the Hall effect device output voltage. Thus, output of the converter is taken at the collector terminal of the transistor 32 and is a current which is proportional to the above mentioned voltage differential.

Figure 4:
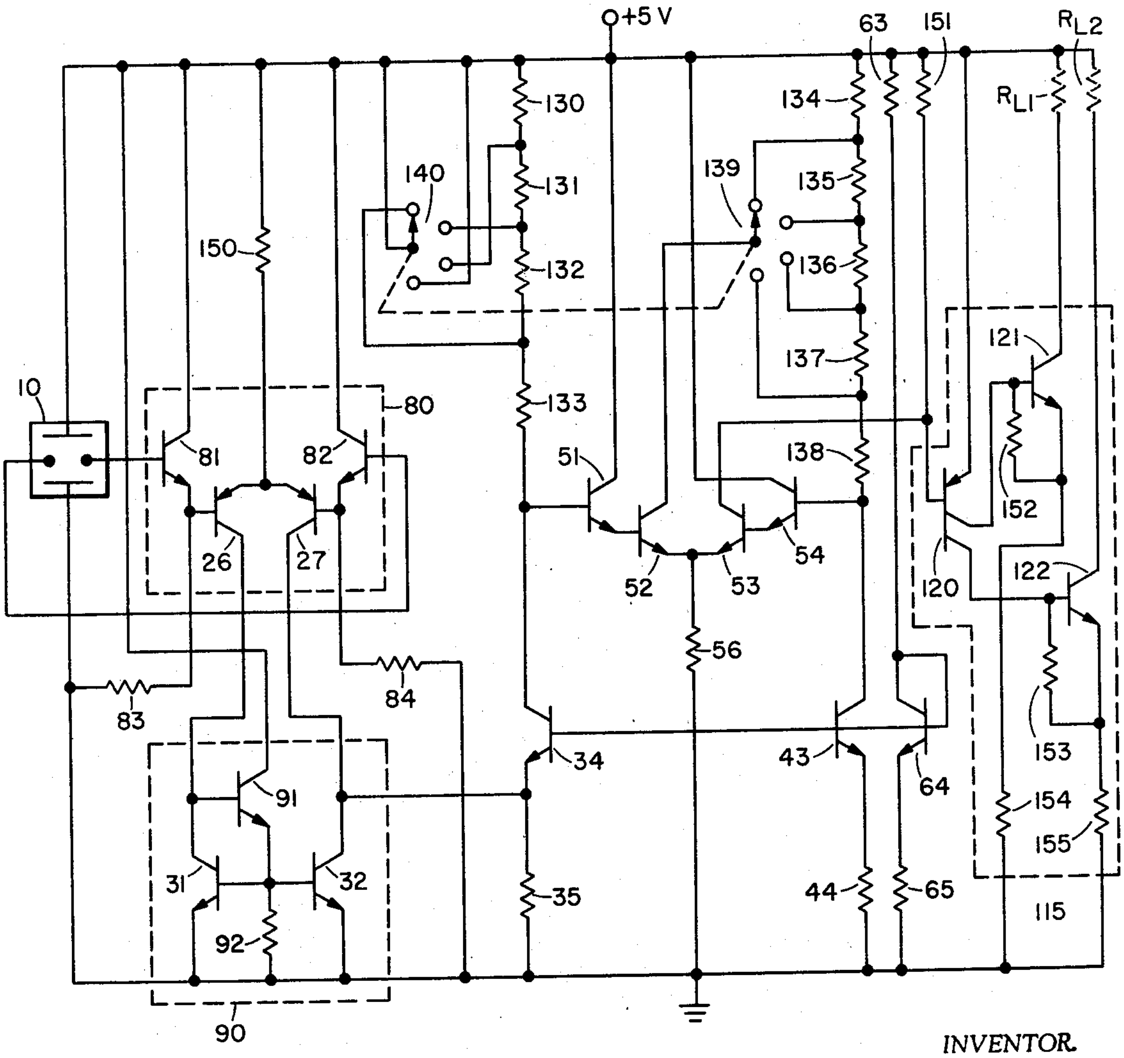
FIG. 4 is a schematic diagram of an alternate embodiment of the invention showing a specialized differential amplifier, converter and output stage.

Alternatively this converter can take the form of the converter shown surrounded by dotted box 90 of FIG. 4. It will be appreciated that direct coupling of the bases of the transistors 31 and 32 to one of the output legs of the differential amplifier draws a substantial amount of current from this leg. This in turn unbalances the output of the differential amplifier. If, however, the current drawn by these bases is generated by a variable voltage source, much less current need by tapped from this leg to control the variable current source. Thus, only a negligible imbalance results. The variable voltage source is shown by an NPN transistor 91 which has its base coupled to one leg of the differential amplifier and which has its emitter coupled to the aforementioned bases and to a biasing resistor 92. Current drawn from the leg coupled to the collector of the transistor 31 is typically 100 times less in this configuration than that drawn by the circuit shown in FIG. 2. The current generated at the collector of the transistor 32 in FIG. 2 is applied to the emitter of the transistor 34 which serves as the variable current source 20.

The transistor 34, in combination with resistors 35 and 36, comprises one leg of the trigger circuit shown in dotted box 30 with the transistor 34 being a variable current source. The other leg of the trigger is formed by resistors 41 and 42, transistor 43 and the emitter to ground resistor 44 with the transistor 43 being a constant current source. Since the bases of both the transistor 34 and the transistor 43 are provided with the same bias potential, the trigger is unbalanced if the resistances in the legs are unbalanced.

It will be appreciated that the trigger circuit is composed of NPN transistors 51, 52, 53 and 54 in which the transistors 52 and 53 have interconnected emitters, the transistors 51 and 54 have emitters coupled to the bases of the transistors 52 and 53, respectively, and wherein the collectors of the transistors 51 and 54 are connected to a positive source of potential voltage. The collector of the transistor 52 is connected between the voltage divider formed by the resistors 41 and 42, while the collector of the transistor 53 provides the output for the trigger circuit. The interconnected emitters of the transistors 52 and 53 are coupled to ground through a resistor 56, which completes the trigger circuit. This trigger circuit is in the form of a Schmidt trigger, although other trigger circuits are contemplated as being within the scope of this invention if they can be controlled by a differential current. This would include current controlled multivibrator circuits and current controlled flip-flops. It will be appreciated that a circuit of this configuration has a characteristic hysteresis defined as that voltage differential across the bases of the transistors 51 and 54 which cause the device to conduct, minus that voltage differential which causes the device to cease conducting. This voltage differential is called the hysteresis. These voltage differentials are developed across the resistor 36 and the resistors 41 and 42 by the current generated at the transistors 34 and 43. Since the transistor 34 is controlled at its output by the Hall effect device 10, the voltage differential across the transistors 51 and 54 is an amplified function of the Hall voltage. This voltage differential is much larger than the Hall voltage differential. Thus this system is compatible with high hysteresis switching circuits. It will be appreciated that the hysteresis is determined by the particular circuit configuration. It is possible to build a trigger circuit having a hysteresis of as little as 5 millivolts although triggers within excess of 20 millivolts are more common.

Figure 3:
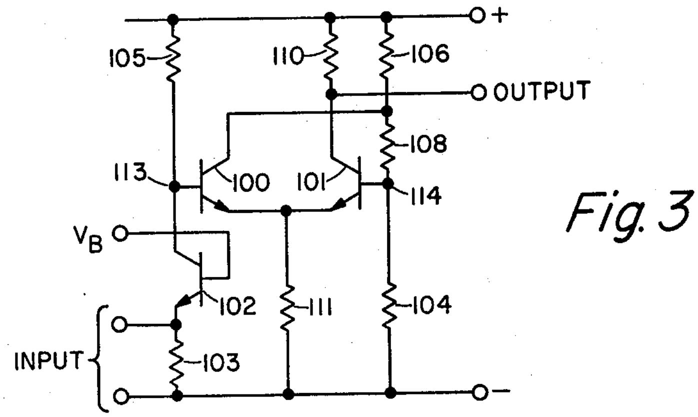
FIG. 3 is a simplified schematic of a trigger circuit with hysteresis.

A simplified schematic of a trigger having hysteresis is shown in FIG. 3 composed of a differential pair of emitter coupled transistors 100 and 101. The input to this trigger circuit is a current developed across variable current source composed of a transistor 102 and a resistor 103 as compared with a current developed across a resistor 104. The two legs of this trigger include a single resistor 105 and a voltage dividing circuit composed of resistors 106 and 108, respectively. Resistors 110 and 111 bias the trigger into conduction.

The hysteresis is provided because, if the transistor 100 is non-conducting, the voltage at the base of the transistor 101 is equal to the voltage drop across the resistor 108. This condition occurs when the voltage at a point 113 is at some predetermined potential. Now if the potential at the point 113 rises to a higher second potential, then the transistor 100 is rendered conductive. This pulls current through the resistor 106 such that the voltage at a point 114 drops. In order to render the transistor 100 non-conductive again, the voltage at the point 113 must drop to a point lower than the second potential because the base of transistor 114 is at a lower potential. This voltage difference is the hysteresis and it is the hysteresis of the trigger which makes it less susceptible to transient voltage swings.

This simplified trigger circuit is expanded in the common emitter configuration shown in FIG. 2. The voltage which controls the trigger is that applied at points 60 and 61. This voltage is, in turn, dependent upon the current drawn through the resistive element 36 and the resistive elements 41 and 42 in the respective legs of the trigger 30. If the resistors 35 and 44 are fixed equal and of a relatively high value, in the thousands of ohms, then the voltage differential between the points 60 and 61 will be determined by the current differential between that through the resistor 36 and that through the resistors 41 and 42. If the resistor 36 has a value equal to the sum of the series connected resistors 41 and 42, there will be a current balance in the circuit. However, when there is no Hall effect voltage delivered to the differential amplifier there is no current supplied to the emitter of the transistor 34. Thus, if the resistor 36 equals the combined resistance of the resistors 41 and 42, the legs would be balanced. The resistance values of the resistors 36, 41 and 42 are specifically chosen such that the trigger circuit is unbalanced and is in an OFF or non-conducting region when there is no Hall effect voltage delivered to the terminals of the differential amplifier. When an appropriate magnetic field is placed at or near the Hall effect device 10 the voltage at the emitter of the transistor 34 rises, thus causing more current to be drawn in the lefthand leg of the trigger circuit. The voltage at the point 60 rises as the current in this leg rises; and it rises with respect to the voltage at the point 61, until the point is reached where the trigger is fired. The trigger circuit remains in this fired condition until the Hall effect voltage falls below a predetermined level. This corresponds to a lowering of the current being generated by the current source composed of the transistor 34 and the resistor 35. Normally, because of the high hysteresis of the trigger circuit it takes a large voltage differential between the points 60 and 61 to turn the trigger circuit ON. This large voltage differential is generated in response to the output of the Hall effect device by the differential amplifier and variable current source arrangement. Thus, small Hall effect voltages effectively turn ON and turn OFF a device which is controlled by large voltage swings.

A further explanation of the operation of the trigger circuit 30 is as follows. Assume that the current generated by the transistor 34 is decreasing causing the point 60 to rise with respect to the point 61 until the transistor 52 turns ON and the transistor 53 turns OFF. When the transistor 52 turns ON, its collector current is derived from the positive supply through the resistor 41 causing an increased voltage drop across this resistor. This in turn results in a drop of the point 61 by the same amount. Now assume the current through the transistor 34 begins to increase, thus causing the point 60 to drop. The transistor 52 will not turn OFF until the potential at the point 60 approaches that at the point 61; but the potential at the point 61 is now lower due to the conduction of the transistor 52 and a corresponding collector current. Thus the "OFF" point will be lower than the "ON" point. This results in the required hysteresis.

The bias supply for the current source 20 is shown in dotted box 40 to be composed of a resistor 63 in series with a diode connected transistor 64, whose emitter is coupled to ground through a resistor 65. The use of this particular bias supply is merely convenient since the transistors 34, 43 and 64 may be of the same general configuration.

It will be appreciated that the hysteresis of the trigger circuit can be varied by varying the resistor 36 in combination with the resistors 41 and 42. In the case shown, the resistor 36 has a value of 5.26 kilohms, the resistor 41 has a value of 590 ohms and the resistor 42 has a value of 3,720 ohms. In this configuration the hysteresis of the circuit is at a minimum and at a value of 5 millivolts as measured at the differential amplifier input terminals. For a hysteresis of 10 millivolts, the resistor 36 carries a value of 5.46 kilohms, the resistor 41 has a value of 940 ohms and the resistor 42 has a value of 3,570 ohms. In general the left side of the circuit comprising of the resistors 41 and 42 combined, have a combined total of resistance of 4,310 ohms while the resistor 36 varies from 5.26 kilohms to 5.86 kilohms in order to vary the hysteresis of the trigger 30 from 5 millivolts to 20 millivolts.

An automated way of changing the hysteresis of the trigger is shown in FIG. 4 by resistors 130–138 and switches 139 and 140. In one configuration the values of resistors 130–138 are as follows:

$R_{130}$ = 200 ohms
$R_{131}$ = 200 ohms
$R_{132}$ = 200 ohms
$R_{133}$ = 5.26 kilohms
$R_{134}$ = 590 ohms
$R_{135}$ = 350 ohms
$R_{136}$ = 450 ohms
$R_{137}$ = 620 ohms
$R_{138}$ = 2.5 kilohms With switches rotated clockwise from the positions shown, the hysteresis of the trigger circuit for the four positions shown is:

position 1: 5 millivolts
position 2: 10 millivolts
position 3: 15 millivolts
position 4: 20 millivolts Other resistances in the circuit are as follows:

| | | |
|---|---|---|
| $R_{63}$ | = | 6.7 kilohms |
| $R_{83}$, $R_{84}$ | = | 3.6 kilohms |
| $R_{150}$ | = | 3.68 kilohms |
| $R_{35}$, $R_{44}$, $R_{65}$ | = | 2.0 kilohms |
| $R_{56}$ | = | 1.6 kilohms |
| $R_{151}$ | = | 3.9 kilohms |
| $R_{152}$, $R_{153}$ | = | 10.0 kilohms |
| $R_{154}$, $R_{155}$ | | 450 ohms |

The output of the trigger 30, in the configuration shown in dotted box 114 of FIG. 4, is connected to the base of a double collector PNP device 120 whose collectors are each coupled to the bases of two NPN follower transistors 121 and 122. This provides an amplified double output shown at $R_{L1}$ and $R_{L2}$ necessary for computer keyboard applications.

It will be appreciated that the switches 139 and 140 may be replaced by shorting strips fabricated during the masking process, such that devices of different hysteresis can be manufactured during masking.

What is claimed is:

1. A Hall effect switching circuit comprising in combination:

a Hall effect device having two output terminals across which is developed a Hall voltage whenever appropriately oriented electric and magnetic fields are simultaneously applied thereto, a differential amplifier having differential input terminals coupled to respective output terminals of said Hall effect device and an output terminal at which is generated a current proportional to the magnitude of said Hall voltage;

a trigger circuit having a pair of input terminals across which a first predetermined voltage differential must be maintained in order to produce a signal at the output terminal thereof at a first value and across which a lower second predetermined voltage differential must be maintained in order to limit said output signal to a second value; and current source means coupled with the output terminal of said differential amplifier and responsive to the magnitude of said generated current for maintaining said first predetermined voltage differential across the input terminals of said trigger circuit when said generated current is above a first predetermined level and for maintaining said second predetermined voltage differential across the input terminals of said trigger circuit when said generated current is below a second predetermined current, whereby said trigger circuit is fired and produces an output signal of the first value whenever said Hall voltage reaches a predetermined value.

2. The switching circuit as recited in claim 1 wherein said mentioned means for maintaining predetermined voltage differentials includes a variable current source coupled with the output terminal of said differential amplified and coupled to one of the input terminals to said trigger circuit and a constant current source coupled to the other of the input terminals to said trigger circuit, said variable current source generating a current proportional to the current generated by said differential amplifier.

3. The switching circuit as recited in claim 2 wherein said trigger circuit is a Schmidt trigger and wherein said differential amplifier contains transistors of one conductivity type connected so as to produce a differential current corresponding to said Hall voltage and further including a differential to signal-ended converter which generates said current proportional to said Hall voltage from the differential current generated at the collectors of said transistors.

4. A magnetically actuated switching circuit comprising in combination:

means operative in response to the presence of a magnetic field of a predetermined magnitude at a location for generating a voltage proportional to the strength of the field at said location;

means coupled with said voltage generating means for generating a current proportional to the magnitude of said voltage; and means coupled with said current generating means and operative in response to the magnitude of said current above a first predetermined threshold level for generating a signal and for interrupting said signal in response to the magnitude of said current falling below a second predetermined threshold, whereby the generation of said signal indicates the presence of said magnetic field at said location.

5. The circuit as recited in claim 4 wherein said means for generating a signal includes a trigger circuit which is actuated by a predetermined current differential at the inputs thereto and means for varying the current available at one of said inputs in response to the magnitude of the current generated by said current generating means such that said trigger circuit is actuated by the presence of said magnetic field at said location.

6. The circuit as recited in claim 5 wherein the current available at the other of the inputs of said trigger circuit is held constant such that said current differential is varied by varying the current to said one input.

7. The circuit as recited in claim 6 wherein said means for generating a voltage is a Hall effect device and wherein said voltage is the Hall voltage.

8. The circuit as recited in claim 7 wherein said means for generating a current is a differential amplifier.

9. The circuit as recited in claim 8 wherein said differential amplifier provides two currents having a difference proportional to said Hall voltage and further including a differential to single-ended current converter coupled to said two currents such that the output of said converter is said generated current proportional to the magnitude of said difference and thus the magnitude of said Hall voltage.

10. A Hall effect switch comprising:

A power supply having two terminals across which a potential voltage is developed;

A Hall effect device, said device having two output terminals and providing an output voltage across said terminals whenever an appropriately oriented magnetic field is applied across said device;

A differential amplifier having a single-ended output current, the amplitude of said output current being proportional to the output voltage available across said terminals, said differential amplifier including:

a first pair of PNP transistors having interconnected emitters, a first resistive element coupled between said interconnected emitters of said first pair and one terminal of said power supply, a first pair of NPN transistors, the bases of different transistors in said first pair of NPN transistors coupled to different output terminals of said Hall effect device, the collectors thereof coupled to said one terminal of said power supply and the emitters of different ones of said first pair of NPN transistors coupled to different bases of the transistors in said first pair of PNP transistors, second and third resistive elements coupled between the other of the terminals of said power supply and different emitters of the transistors in said first pair of NPN transistors so as to bias said last mentioned transistors into conduction, a second pair of NPN transistors having interconnected bases, having collectors coupled to different collectors of the transistors in said first pair of PNP transistors and having emitters coupled to said other terminal of said power supply, a first NPN transistor having its base coupled to the collector of one transistor in said second pair of NPN transistors, having its collector coupled to said one terminal of said power supply and having its emitter coupled to said interconnected bases, a fourth resistive element coupled between the emitter of said first NPN transistor and said other terminal of said power supply so as to form a variable current source for said interconnected bases in conjunction with said first NPN transistor, the output of said differential amplifier being at the collector of one of the transistors in said second pair of NPN transistors;

A variable current source, said current source including:

a third pair of NPN transistors having interconnected bases and collectors which form first and second current delivery terminals, fifth and sixth resistive elements coupled respectively between different emitters of said third pair of NPN transistors and said other terminal of said power supply, and means for establishing a fixed bias voltage at the bases of said third pair of NPN transistors, the output of said differential amplifier being coupled to the emitter of one of the transistors in said third pair of NPN transistors such that the current generated by said one transistor in said third pair of NPN transistors is proportional to said Hall device output voltage;

Trigger circuit means coupled between said first and second current delivery terminal, said trigger circuit including:

a fourth pair of NPN transistors having interconnected emitters, a seventh resistive element coupled between said last mentioned interconnected emitters and said other terminal of said power supply, a fifth pair of NPN transistors having emitters coupled to the bases of different transistors in said fourth pair of NPN transistors, having their collectors coupled to said one terminal of said power supply and having their bases coupled to said first and second current delivery terminals respectively, a voltage dividing circuit coupled between said second current delivery terminal and said one terminal of said power supply, a point intermediate the ends of said voltage dividing circuit being coupled to the collector of that transistor in said fourth pair of NPN transistors whose base is connected through one of said fifth pair of NPN transistors to said first current delivery terminal, an eighth resistive element coupled between said first current delivery terminal and said one terminal of said power supply, whereby said voltage dividing circuit and said eighth resistive element provide said trigger circuit with a predetermined hysteresis, the output of said trigger circuit being available at the collector of that transistor in said fourth pair of NPN transistors which is connected through one of said fifth pair of NPN transistors to said second current delivery terminal, and a ninth resistive element coupled between said one terminal of said power supply and the collector of said last mentioned transistor in said fourth pair so as to bias it into conduction;

An output stage coupled to the output of said trigger circuit including:

a first PNP transistor having an emitter coupled to said one terminal of said power supply, having its base coupled to the output of said trigger circuit and having a pair of collectors, second and third NPN transistors, each having its base coupled to a different one of said pair of collectors, ninth and 10th resistive elements coupled between the bases and emitters of said second and third NPN transistors respectively, and 11th and 12th resistive elements coupled between the emitters of said second and third NPN transistors respectively and said other terminal of said power supply, whereby the output of said Hall effect switch is taken between either the collector of said second or the collector of said third NPN transistor and said one terminal of said power supply.

* * * * *